(12) United States Patent
Kim et al.

(10) Patent No.: US 12,322,702 B2
(45) Date of Patent: Jun. 3, 2025

(54) SEMICONDUCTOR PACKAGE

(71) Applicant: Samsung Electronics Co., Ltd., Suwon-si (KR)

(72) Inventors: Dongkyu Kim, Anyang-si (KR); Seokkyu Choi, Cheonan-si (KR); Minjung Kim, Cheonan-si (KR); Seokhyun Lee, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 475 days.

(21) Appl. No.: 17/683,774

(22) Filed: Mar. 1, 2022

(65) Prior Publication Data
US 2022/0415802 A1 Dec. 29, 2022

(30) Foreign Application Priority Data
Jun. 28, 2021 (KR) .......................... 10-2021-0083765

(51) Int. Cl.
| | |
|---|---|
| *H01L 23/538* | (2006.01) |
| *H01L 23/00* | (2006.01) |
| *H01L 23/31* | (2006.01) |
| *H01L 23/498* | (2006.01) |
| *H01L 23/66* | (2006.01) |

(52) U.S. Cl.
CPC ...... *H01L 23/5383* (2013.01); *H01L 23/3128* (2013.01); *H01L 23/49816* (2013.01); *H01L 23/66* (2013.01); *H01L 24/16* (2013.01); *H01L 24/48* (2013.01); *H01L 2223/6677* (2013.01); *H01L 2224/16227* (2013.01); *H01L 2224/48227* (2013.01)

(58) Field of Classification Search
CPC ............... H01L 23/66; H01L 23/3128; H01L 23/49816; H01L 2223/6677; H01L 2224/16227; H01L 24/81
See application file for complete search history.

(56) References Cited

U.S. PATENT DOCUMENTS

| | | |
|---|---|---|
| 6,770,955 B1 | 8/2004 | Coccioli et al. |
| 9,196,951 B2 * | 11/2015 | Baks ................. H01Q 1/2283 |
| 9,368,450 B1 | 6/2016 | Gu et al. |
| 9,576,933 B1 | 2/2017 | Lo |
| 10,784,901 B2 | 9/2020 | Kudekar et al. |

(Continued)

*Primary Examiner* — Ictor A Mandala
*Assistant Examiner* — Lawrence C Tynes, Jr.
(74) *Attorney, Agent, or Firm* — Harness, Dickey & Pierce, P.L.C.

(57) ABSTRACT

A semiconductor package includes a redistribution substrate including a first surface and a second surface that are opposite to each other, an antenna substrate on the first surface and including a first insulating portion and antenna patterns on a top surface of the first insulating portion, and a first semiconductor chip on the second surface. The redistribution substrate includes a second insulating portion, and a redistribution pattern in the second insulating portion. The redistribution pattern includes an interconnection portion extending parallel to a top surface of the second insulating portion, and a via portion protruding from the interconnection portion toward the first surface. A width of the via portion decreases as a height in a direction from the second surface toward the first surface increases. The active surface of the first semiconductor chip is adjacent to the second surface.

18 Claims, 12 Drawing Sheets

(56) References Cited

U.S. PATENT DOCUMENTS

| | | | |
|---|---|---|---|
| 2018/0159203 A1* | 6/2018 | Baks | H01Q 9/045 |
| 2018/0315715 A1* | 11/2018 | Chiu | H01L 23/552 |
| 2018/0331027 A1* | 11/2018 | Chen | H01L 23/49816 |
| 2020/0035625 A1* | 1/2020 | Wang | H01L 23/552 |
| 2020/0075503 A1 | 3/2020 | Chuang et al. | |
| 2020/0135654 A1* | 4/2020 | Lee | H01L 24/05 |
| 2020/0185815 A1* | 6/2020 | Lee | H01Q 21/08 |
| 2020/0194362 A1 | 6/2020 | Park et al. | |
| 2020/0212537 A1 | 7/2020 | Chuang et al. | |
| 2021/0036413 A1 | 2/2021 | Kim et al. | |
| 2021/0098421 A1 | 4/2021 | Wu et al. | |
| 2022/0344230 A1* | 10/2022 | Chang | H01L 23/552 |
| 2022/0384323 A1* | 12/2022 | Jin | H01L 21/481 |

* cited by examiner

SEMICONDUCTOR PACKAGE

CROSS-REFERENCE TO RELATED APPLICATION

This U.S. non-provisional patent application claims priority under 35 U.S.C. § 119 to Korean Patent Application No. 10-2021-0083765, filed on Jun. 28, 2021, in the Korean Intellectual Property Office, the disclosure of which is hereby incorporated by reference in its entirety.

BACKGROUND

Example embodiments of the inventive concepts relate to semiconductor packages, and more particularly, to semiconductor packages including an antenna pattern.

As the performances of electronic devices have been improved, frequencies and bandwidths used in various components mounted in mobile devices (e.g., smart phones) have been increased. In particular, it may be required to minimize mutual interference between components in a mm-wave and 5G antenna module. In addition, miniaturization of the antenna module may be required. Furthermore, restrictions on a size and a thickness of the antenna module may be required to secure the degree of freedom of a mounting position.

SUMMARY

Some example embodiments of the inventive concepts may provide semiconductor packages with improved electrical characteristics and reliability.

Some example embodiments of the inventive concepts may also provide miniaturized semiconductor packages.

According to an example embodiment, a semiconductor package may include a redistribution substrate including a first surface and a second surface that are opposite to each other, an antenna substrate on the first surface of the redistribution substrate, the antenna substrate including a first insulating portion and antenna patterns on a top surface of the first insulating portion, and a first semiconductor chip on the second surface of the redistribution substrate. The redistribution substrate may include a second insulating portion and a redistribution pattern in the second insulating portion. The redistribution pattern may include an interconnection portion extending parallel to a top surface of the second insulating portion, and a via portion protruding from the interconnection portion toward the first surface of the redistribution substrate. A width of the via portion may decrease as a height in a direction from the second surface toward the first surface of the redistribution substrate increases. The first semiconductor chip may include an active surface and an inactive surface that are opposite to each other. The active surface of the first semiconductor chip may be adjacent to the second surface of the redistribution substrate.

According to an example embodiment, a semiconductor package may include a redistribution substrate including a first surface and a second surface that are opposite to each other, an antenna substrate on the first surface of the redistribution substrate, the antenna substrate including a first insulating portion and antenna patterns on a top surface of the first insulating portion, a first semiconductor chip on the second surface of the redistribution substrate, and a molding layer covering the first semiconductor chip. At least one of the antenna patterns may be electrically connected to the first semiconductor chip. The redistribution substrate may include a second insulating portion and a redistribution pattern in the second insulating portion. The redistribution pattern may include an interconnection portion extending parallel to a top surface of the second insulating portion, and a via portion protruding from the interconnection portion toward the first surface of the redistribution substrate. A width of an upper portion of the via portion may be less than a width of a lower portion of the via portion. The molding layer may be in contact with an active surface and an inactive surface of the first semiconductor chip that are opposite to each other.

According to an example embodiment, a semiconductor package may include a redistribution substrate including a first surface and a second surface that are opposite to each other, an antenna substrate on the first surface of the redistribution substrate, the antenna substrate including a first insulating portion, antenna patterns on a top surface of the first insulating portion, via structures penetrating the first insulating portion and electrically connecting to the antenna patterns, respectively, and a shielding layer between the via structures adjacent to each other, connection terminals between the antenna substrate and the redistribution substrate, first connection pads between the redistribution substrate and the connection terminals, second connection pads between the via structures and the connection terminals, each of a first semiconductor chip, a second semiconductor chip and a passive element being on the second surface of the redistribution substrate, each of the first and second semiconductor chips including an active surface and an inactive surface that are opposite to each other, first chip pads adjacent to the active surface of the first semiconductor chip, second chip pads adjacent to the active surface of the second semiconductor chip, first conductive terminals between the redistribution substrate and the first chip pads, second conductive terminals between the redistribution substrate and the second chip pads, and a molding layer covering the first semiconductor chip and the second semiconductor chip. The redistribution substrate may include a second insulating portion, redistribution patterns in the second insulating portion, and under bump patterns between the redistribution patterns and the first and second conductive terminals. The redistribution pattern may include an interconnection portion extending parallel to a top surface of the second insulating portion, and a via portion protruding from the interconnection portion toward the first surface of the redistribution substrate. A width of the via portion may decrease as a height in a direction from the second surface toward the first surface of the redistribution substrate increases. The active surface of each of the first and second semiconductor chips may be adjacent to the second surface of the redistribution substrate.

BRIEF DESCRIPTION OF THE DRAWINGS

The inventive concepts will become more apparent in view of the attached drawings and accompanying detailed description.

DETAILED DESCRIPTION

Figure 1:
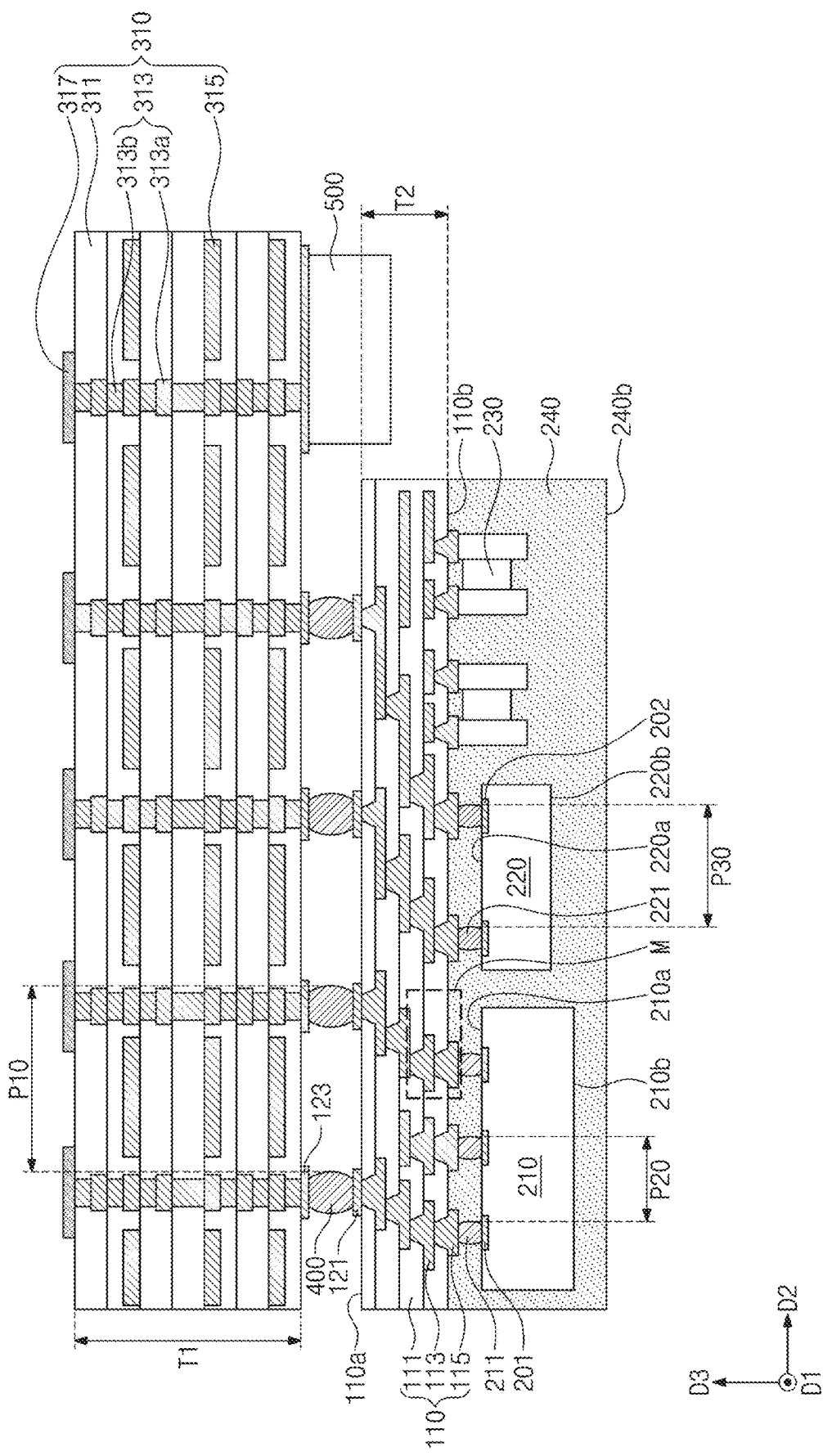
FIG. 1 is a cross-sectional view illustrating a semiconductor package according to some example embodiments of the inventive concepts.
Figure 2:
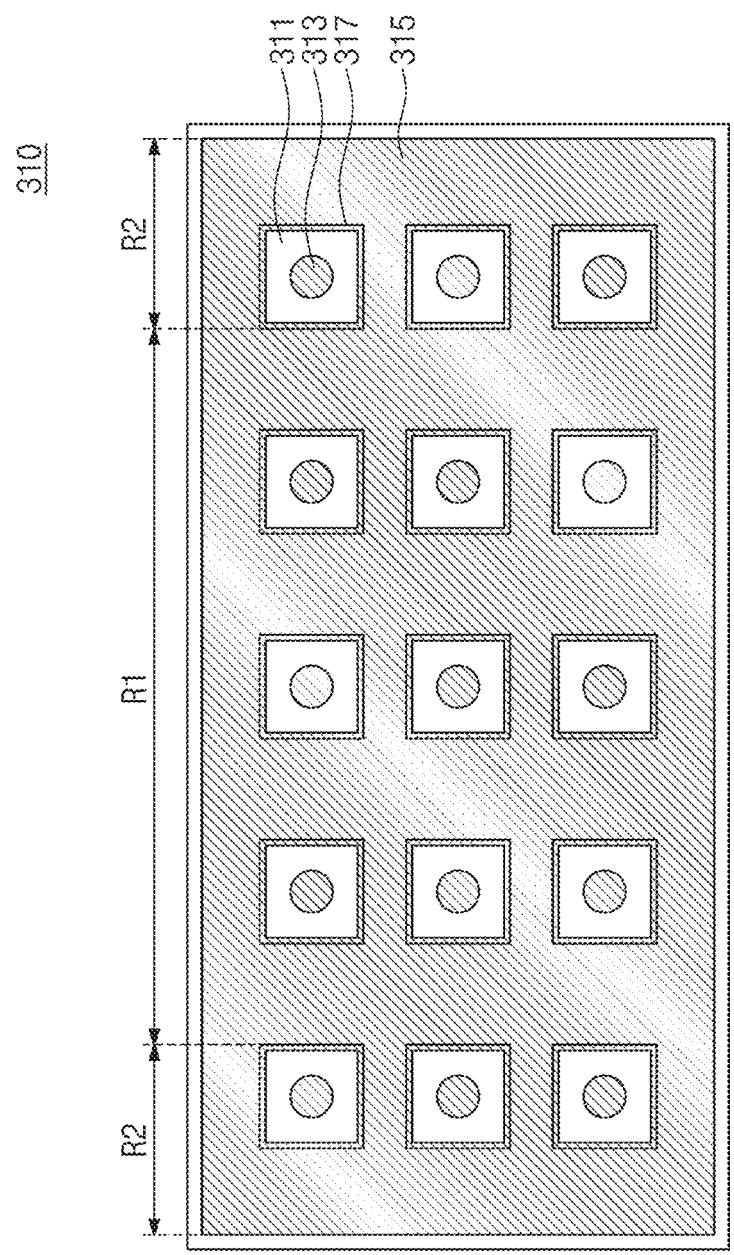
FIG. 2 is a plan view illustrating an antenna substrate according to some example embodiments of the inventive concepts.
Figure 3:
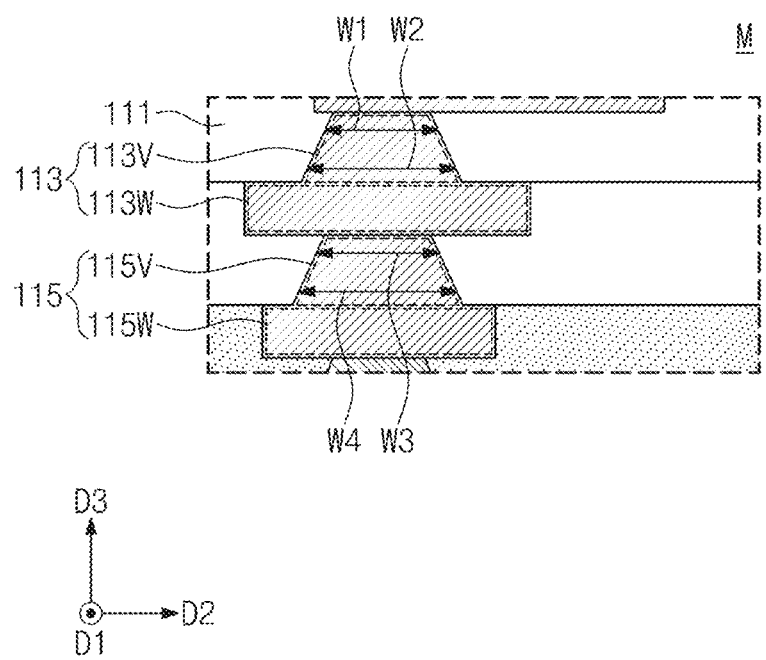
FIG. 3 is an enlarged cross-sectional view of a region 'M' of FIG. 1.

FIG. 1 is a cross-sectional view illustrating a semiconductor package according to some example embodiments of the inventive concepts. FIG. 2 is a plan view illustrating an antenna substrate according to some example embodiments of the inventive concepts. FIG. 3 is an enlarged cross-sectional view of a region 'M' of FIG. 1.

Referring to FIGS. 1 and 2, a semiconductor package may include a redistribution substrate 110, a first semiconductor chip 210, and an antenna substrate 310.

The redistribution substrate 110 may include a first surface 110a and a second surface 110b, which are opposite to each other. The first surface 110a of the redistribution substrate 110 may be a top surface of the redistribution substrate 110, and the second surface 110b of the redistribution substrate 110 may be a bottom surface of the redistribution substrate 110. The redistribution substrate 110 may be referred to as an interconnection structure.

The redistribution substrate 110 may include a first insulating portion 111, redistribution patterns 113, and an under bump pattern 115. For example, the first insulating portion 111 may include an organic material or photo imageable dielectric (PID), such as a photosensitive polymer. In the present specification, the photosensitive polymer may include at least one of, for example, photosensitive polyimide, polybenzoxazole, a phenol-based polymer, or a benzocyclobutene-based polymer. The first insulating portion 111 may include a plurality of stacked insulating layers.

The redistribution patterns 113 may be disposed in the first insulating portion 111. Each of the redistribution patterns 113 may include copper (Cu), aluminum (Al), silver (Ag), tin (Sn), gold (Au), nickel (Ni), lead (Pb), titanium (Ti), or any combination thereof. Some of the redistribution patterns 113 may be used as connection lines for electrically connecting the first semiconductor chip 210, a second semiconductor chip 220 and a passive element 230, to be described later, to the antenna substrate 310.

The under bump pattern 115 may be provided on the second surface 110b of the redistribution substrate 110. The under bump pattern 115 may function as a pad of each of first and second conductive terminals 211 and 221 to be described later. The under bump pattern 115 may include copper (Cu), aluminum (Al), silver (Ag), tin (Sn), gold (Au), nickel (Ni), lead (Pb), titanium (Ti), or any combination thereof. The under bump pattern 115 may penetrate a lowermost one of the insulating layers constituting the first insulating portion 111 so as to be in contact with a portion of the redistribution patterns 113.

The redistribution pattern 113 and the under bump pattern 115 will be described in more detail with reference to FIG. 3.

Referring to FIG. 3, for example, at least one of the redistribution patterns 113 may include an interconnection portion 113W and a via portion 113V. The interconnection portion 113W may be a portion of the redistribution pattern 113, which extends in a direction parallel to a top surface of the first insulating portion 111. The via portion 113V may be provided on the interconnection portion 113W. The via portion 113V and the interconnection portion 113W may be connected to each other in one body. The via portion 113V may be a portion of the redistribution pattern 113, which protrudes from the interconnection portion 113W in a direction (e.g., a third direction D3) perpendicular to the top surface of the first insulating portion 111. For example, the via portion 113V may protrude from the interconnection portion 113W in a direction from the second surface 110b toward the first surface 110a of the redistribution substrate 110. The interconnection portion 113W may have a width or length greater than that of the via portion 113V. The via portion 113V may be provided on a top surface of a corresponding one of the insulating layers of the first insulating portion 111. The interconnection portion 113W may be provided under a top surface of a corresponding one of the insulating layers of the first insulating portion 111. Some of the redistribution patterns 113 may not include the via portion 113V.

The under bump pattern 115 may include a via portion 115V penetrating the lowermost one of the insulating layers of the first insulating portion 111 so as to be in contact with the redistribution pattern 113, and a body portion 115W provided under the via portion 115V. The body portion 115W of the under bump pattern 115 may not be covered by the first insulating portion 111. The via portion 115V of the under bump pattern 115 may protrude from the body portion 115W of the under bump pattern 115 in the direction (e.g., the third direction D3) perpendicular to the top surface of the first insulating portion 111.

An upper width of the via portion 113V of the redistribution pattern 113 may be a first width W1. A lower width of the via portion 113V of the redistribution pattern 113 may be a second width W2. The first width W1 may be less than the second width W2. A width of the via portion 113V of the redistribution pattern 113 may decrease as a height in the direction from the second surface 110b toward the first surface 110a of the redistribution substrate 110 increases.

An upper width of the via portion 115V of the under bump pattern 115 may be a third width W3. A lower width of the via portion 115V of the under bump pattern 115 may be a fourth width W4. The third width W3 may be less than the fourth width W4. A width of the via portion 115V of the under bump pattern 115 may decrease as a height in the direction from the second surface 110b toward the first surface 110a of the redistribution substrate 110 increases.

Referring again to FIGS. 1 and 2, the first semiconductor chip 210 may be provided on the second surface 110b of the redistribution substrate 110. The first semiconductor chip 210 may include an active surface 210a and an inactive surface 210b, which are opposite to each other. The active surface 210a of the first semiconductor chip 210 may be disposed adjacent to the second surface 110b of the redistribution substrate 110. For example, the active surface 210a of the first semiconductor chip 210 may be spaced apart from the redistribution substrate 110.

Because the active surface 210a of the first semiconductor chip 210 is disposed adjacent to the second surface 110b of the redistribution substrate 110, the active surface 210a of the first semiconductor chip 210 may be disposed in a direction toward the antenna substrate 310 to be described later in detail. Thus, an electrical path between the first semiconductor chip 210 and the antenna substrate 310 may be shortened, and thus a signal transmission speed may be improved. Accordingly, electrical characteristics of the semiconductor package may be improved.

The first semiconductor chip 210 may include first chip pads 201. The first chip pads 201 may be disposed adjacent to the active surface 210a of the first semiconductor chip 210. A top surface of each of the first chip pads 201 may be exposed at the active surface 210a of the first semiconductor chip 210. First conductive terminals 211 may be disposed between the first chip pads 201 and some of the under bump patterns 115, respectively. The first chip pads 201 may include a conductive metal material. Each of the first conductive terminals 211 may include at least one of a solder, a pillar, or a bump. The first conductive terminals 211 may include a conductive material such as a solder material.

An integrated circuit in the first semiconductor chip 210 may include a radio frequency integrated circuit (RFIC). The first semiconductor chip 210 may be electrically connected to antenna patterns 317 to be described later and thus may be configured to radiate an antenna signal. In certain example embodiments, the integrated circuit of the first semiconductor chip 210 may include electronic devices. For example, the integrated circuit of the first semiconductor chip 210 may include electronic devices (e.g., a power management integrated circuit (PMIC), a modem, a transceiver, a power amp module (PAM), a frequency filter, and/or a low noise amplifier (LNA)) in addition to the radio frequency integrated circuit (RFIC). The integrated circuit of the first semiconductor chip 210 may convert digital signals transmitted from the outside into analog signals and may supply the analog signals to antenna patterns 317 to be described later.

The second semiconductor chip 220 and the passive element 230 may be provided on the second surface 110b of the redistribution substrate 110. The second semiconductor chip 220 may include an active surface 220a and an inactive surface 220b, which are opposite to each other. The active surface 220a of the second semiconductor chip 220 may be disposed adjacent to the second surface 110b of the redistribution substrate 110. For example, the active surface 220a of the second semiconductor chip 220 may be spaced apart from the redistribution substrate 110.

The second semiconductor chip 220 may include second chip pads 202. The second chip pads 202 may be disposed adjacent to the active surface 220a of the second semiconductor chip 220. A top surface of each of the second chip pads 202 may be exposed at the active surface 220a of the second semiconductor chip 220. Second conductive terminals 221 may be disposed between the second chip pads 202 and others of the under bump patterns 115, respectively. The second chip pads 202 may include a conductive metal material. Each of the second conductive terminals 221 may include at least one of a solder, a pillar, or a bump. The second conductive terminals 221 may include a conductive material such as a solder material.

An integrated circuit in the second semiconductor chip 220 may include, for example, a power management integrated circuit (PMIC). The second semiconductor chip 220 may be electrically connected to antenna patterns 317 to be described later and thus may be configured to radiate an antenna signal. The integrated circuit of the second semiconductor chip 220 may convert digital signals transmitted from the outside into analog signals and may supply the analog signals to antenna patterns 317 to be described later.

The passive element 230 may be provided on the second surface 110b of the redistribution substrate 110. For example, the passive element 230 may be provided in plurality. The passive element 230 may be spaced apart from the first and second semiconductor chips 210 and 220 in a second direction D2. The passive element 230 may include at least one of a resistor, a capacitor, or an inductor. Still others of the under bump patterns 115 may be disposed between the passive element 230 and the redistribution pattern 113. For example, thicknesses of the first semiconductor chip 210, the second semiconductor chip 220 and the passive element 230 may be different from each other.

A molding layer 240 may be provided on the second surface 110b of the redistribution substrate 110. The molding layer 240 may cover the first semiconductor chip 210. The molding layer 240 may cover a top surface, a bottom surface and sidewalls of the first semiconductor chip 210. The molding layer 240 may be in contact with the active surface 210a and the inactive surface 210b of the first semiconductor chip 210. The molding layer 240 may also cover the second semiconductor chip 220 and the passive element 230. The molding layer 240 may cover a top surface, a bottom surface and sidewalls of the second semiconductor chip 220. The molding layer 240 may be in contact with the active surface 220a and the inactive surface 220b of the second semiconductor chip 220. For example, the molding layer 240 may include an insulating polymer such as an epoxy-based polymer. A bottom surface 240b and sidewalls of the molding layer 240 may be exposed. In other words, a redistribution substrate may not be provided on the bottom surface 240b of the molding layer 240.

The molding layer 240 may be in contact with the active surfaces 210a and 220a and the inactive surfaces 210b and 220b of the first and second semiconductor chips 210 and 220. In other words, the molding layer 240 may be in contact with the top surfaces and the bottom surfaces of the first and second semiconductor chips 210 and 220. Thus, a warpage phenomenon of the semiconductor package may be effectively controlled or inhibited as compared to a case in which the molding layer 240 is in contact with one of the top surface and the bottom surface of each of the first and second semiconductor chips 210 and 220. Accordingly, reliability of the semiconductor package may be improved.

The antenna substrate 310 may be provided on the first surface 110a of the redistribution substrate 110. The antenna substrate 310 may include a second insulating portion 311, via structures 313, shielding layers 315, and antenna patterns 317.

The second insulating portion 311 may include a plurality of stacked insulating layers. The second insulating portion 311 may include at least one of, but not limited to, a thermosetting resin (e.g., epoxy resin), a thermoplastic resin (e.g., polyimide), a resin obtained by impregnating the thermosetting resin or the thermoplastic resin with a reinforcing material (e.g., a glass fiber and/or an inorganic filler), or a photocurable resin. The second insulating portion 311 may include a different material from that of the first insulating portion 111. In certain example embodiments, each of an uppermost one and a lowermost one of the insulating layers constituting the second insulating portion 311 may include a photosensitive solder resist layer. The antenna substrate 310 may be a printed circuit board (PCB).

The via structures 313 may be provided to penetrate the second insulating portion 311. Each of the via structures 313 may include pad patterns 313a and via patterns 313b, which overlap with each other. The via pattern 313b may electrically connect the pad patterns 313a adjacent to each other in the third direction D3. Each of the pad pattern 313a and the via pattern 313b may include a conductive metal material. For example, each of the pad pattern 313a and the via pattern 313b may include copper (Cu).

The shielding layers 315 may be provided horizontally between the via structures 313 adjacent to each other. The shielding layers 315 may be provided in the second insulating portion 311. The shielding layers 315 may be stacked. Each of the shielding layers 315 may have a mesh shape and may surround the antenna patterns 317 and the via structures 313, when viewed in a plan view (see FIG. 2). The shielding layers 315 may be spaced apart from each other in the third direction D3. The shielding layers 315 may be spaced apart from the via structures 313. The shielding layers 315 may include a conductive metal material. For example, the shielding layers 315 may include copper (Cu). A ground voltage may be applied to the shielding layers 315, and thus the shielding layers 315 may perform an electromagnetic wave blocking function. Accordingly, noise may be reduced when electrical signals are transmitted through the via structures 313. Further, the shielding layers 315 may shield electromagnetic waves emitted from the semiconductor chips.

The antenna patterns 317 may be provided on a top surface of the second insulating portion 311. The antenna patterns 317 may be arranged in an array form when viewed in a plan view. The antenna patterns 317 may be spaced apart from each other at equal intervals. In certain example embodiments, the antenna patterns 317 may be spaced apart from each other at different intervals. The antenna patterns 317 may be arranged throughout an entire area of the second insulating portion 311. The antenna pattern 317 may be electrically connected to the via structure 313. The via structure 313 may vertically overlap the antenna pattern 317.

Each of the antenna patterns 317 may have a plate shape. The antenna pattern 317 may receive an electrical signal from the first or second semiconductor chip 210 or 220 and may radiate an antenna signal in an upward direction and a lateral direction of the second insulating portion 311. In certain example embodiments, the antenna signal may have an omnidirectional characteristic, depending on a structure and a position of the antenna pattern 317. Each of the antenna patterns 317 may include, but not limited to, a conductive metal material such as copper (Cu), aluminum (Al), silver (Ag), tin (Sn), gold (Au), nickel (Ni), lead (Pb), titanium (Ti), or any alloy thereof.

First connection pads 121 may be disposed on the first surface 110*a* of the redistribution substrate 110. Second connection pads 123 may be disposed on a bottom surface of the antenna substrate 310. Each of the first and second connection pads 121 and 123 may include a conductive metal material. A connection terminal 400 may be disposed between the first connection pad 121 and the second connection pad 123. The connection terminal 400 may include at least one of a solder, a pillar, or a bump. The connection terminal 400 may include a conductive material such as a solder material. The antenna substrate 310 and the redistribution substrate 110 may be electrically connected to each other through the connection terminal 400.

A pitch of the connection terminals 400 may be a first pitch P10. A pitch of the first conductive terminals 211 may be a second pitch P20. A pitch of the second conductive terminals 221 may be a third pitch P30. The first pitch P10 may be greater than the second pitch P20 and the third pitch P30. The second pitch P20 may be equal to or different from the third pitch P30. The semiconductor package according to some example embodiments of the inventive concepts may include a fan-out wafer level package.

A thickness of the antenna substrate 310 may be a first thickness T1. A thickness of the redistribution substrate 110 may be a second thickness T2. The first thickness T1 may be defined as a thickness of the second insulating portion 311 in the third direction D3. The second thickness T2 may be defined as a thickness of the first insulating portion 111 in the third direction D3. The first thickness T1 may be greater than the second thickness T2.

The antenna substrate 310 may include the via structures 313 connected to the antenna patterns 317, and the shielding layers 315 for shielding or blocking electromagnetic waves. The antenna substrate 310 of some example embodiments of the inventive concepts may not include internal connection lines for electrically connecting the first semiconductor chip 210, the second semiconductor chip 220 and the passive elements 230. In some example embodiments of the inventive concepts, the first semiconductor chip 210, the second semiconductor chip 220 and the passive elements 230 may be electrically connected to each other through the redistribution patterns 113 in the redistribution substrate 110. In other words, according to some example embodiments of the inventive concepts, the thickness of the antenna substrate 310 may be reduced as compared to a case in which internal connection lines are disposed in the antenna substrate 310. In addition, the redistribution substrate 110 may be manufactured by semiconductor manufacturing processes. Thus, the redistribution patterns 113 and the first insulating portion 111 may be miniaturized and highly integrated, and the thickness of the redistribution substrate 110 may be less than that of the antenna substrate 310 corresponding to a printed circuit board. Accordingly, a total thickness of the semiconductor package may be reduced. Accordingly, the semiconductor package may be miniaturized.

Furthermore, when internal connection lines are formed in the antenna substrate 310, which is a type of a printed circuit board, pattern delamination or short of the internal connection lines may be caused due to the manufacturing process characteristics of the printed circuit board, and thus electrical reliability may be deteriorated. However, according to some example embodiments of the inventive concepts, the redistribution substrate 110 may be manufactured by the semiconductor manufacturing processes, and thus delamination or short may be mitigated, inhibited or prevented, thereby improving electrical reliability of the semiconductor package.

A connector 500 may be disposed on the bottom surface of the antenna substrate 310. The connector 500 may be electrically connected to an external substrate (not shown). The external substrate may be a mother board or main board of various electronic products or may be a body in which the semiconductor package is received directly. However, example embodiments of the inventive concepts are not limited thereto. The external substrate may correspond to at least one of various electronic devices in which the semiconductor package is received, mounted or connected.

One of the second connection pads 123 may be disposed between the connector 500 and the antenna substrate 310. For example, the connector 500 may be electrically connected to one of the antenna patterns 317. In other words, the connector 500 may electrically connect the antenna substrate 310 to the external substrate. The connector 500 may be laterally offset from the redistribution substrate 110.

FIGS. 4A to 4G are cross-sectional views illustrating a method of manufacturing a semiconductor package according to some example embodiments of the inventive concepts.

Figure 4A:
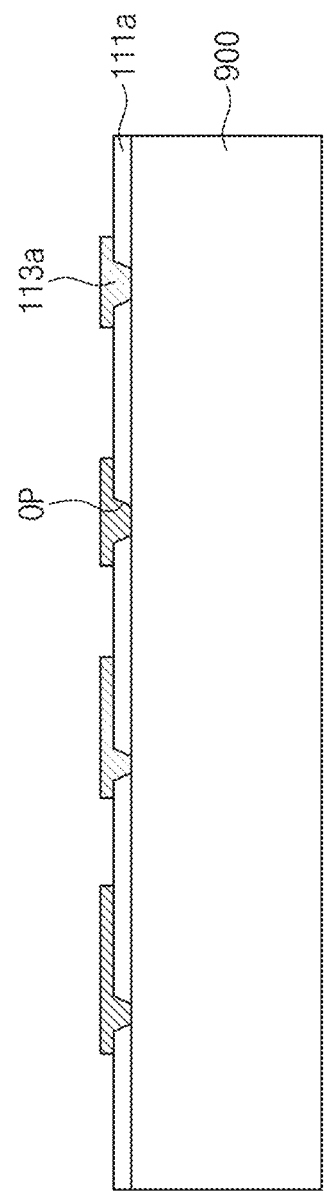
FIGS. 4A to 4G are cross-sectional views illustrating a method of manufacturing a semiconductor package according to some example embodiments of the inventive concepts.

Referring to FIG. 4A, a first insulating layer 111*a* may be formed on a carrier substrate 900. The first insulating layer 111*a* may be formed on an entire top surface of the carrier substrate 900. For example, the first insulating layer 111*a* may be formed by a coating process such as a spin coating process or a slit coating process. For example, the first insulating layer 111a may include a photosensitive polymer. For example, the photosensitive polymer may include at least one of photosensitive polyimide, polybenzoxazole, a phenol-based polymer, or a benzocyclobutene-based polymer.

The first insulating layer 111a may be patterned to form a first hole OP. The patterning of the first insulating layer 111a may be performed by an exposure process and a development process. The first hole OP may expose a top surface of the carrier substrate 900. The first hole OP may have a tapered shape. For example, a diameter of an upper portion of the first hole OP may be greater than a diameter of a lower portion of the first hole OP. A width of the upper portion of the first hole OP may be greater than a width of the lower portion of the first hole OP. An inner sidewall of the first insulating layer 111a may be defined by the first hole OP. A plurality of the first holes OP may be formed.

A first redistribution pattern 113a may be formed on a top surface of the first insulating layer 111a. The first redistribution pattern 113a may be formed at a position corresponding to the first hole OP. A portion of the first redistribution pattern 113a, which is disposed in the first hole OP, may be a via portion. Another portion of the first redistribution pattern 113a, which extends on/from the via portion and runs in parallel to the top surface of the first insulating layer 111a, may be an interconnection portion. For example, the formation of the first redistribution pattern 113a may include forming a seed layer, forming a photoresist pattern on the seed layer, forming a conductive pattern on the seed layer, removing the photoresist pattern, and removing a portion of the seed layer using the conductive pattern as an etch mask. The first redistribution pattern 113a may include a conductive metal material.

Figure 4B:
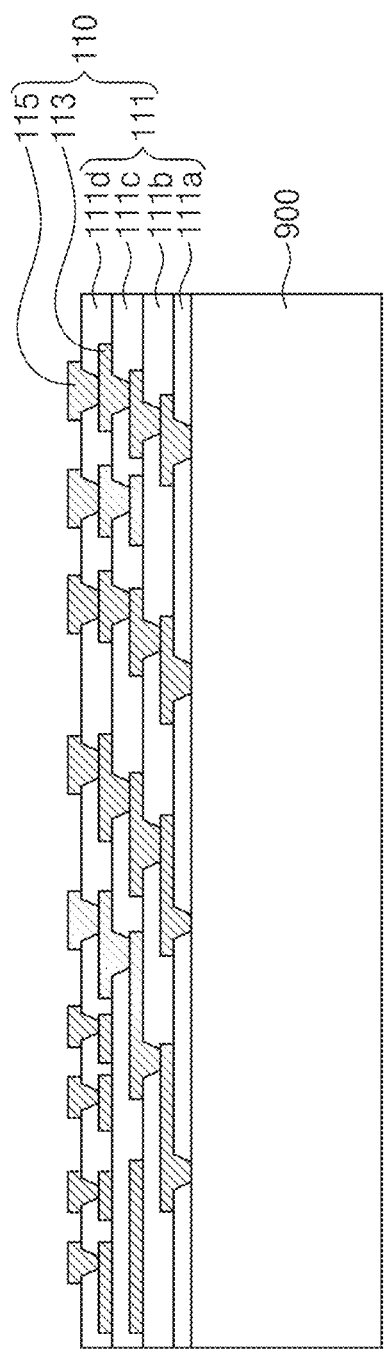

Referring to FIG. 4B, a second insulating layer 111b may be formed on the first insulating layer 111a. A second redistribution pattern may be formed on the second insulating layer 111b. A third insulating layer 111c may be formed on the second insulating layer 111b. A third redistribution pattern may be formed on the third insulating layer 111c. The first to third redistribution patterns may be redistribution patterns 113. A fourth insulating layer 111d may be formed on the third insulating layer 111c. The first to fourth insulating layers 111a to 111d may constitute a first insulating portion 111. An under bump pattern 115 may be formed on the fourth insulating layer 111d. The first insulating portion 111, the redistribution patterns 113 and the under bump pattern 115 may constitute a redistribution substrate 110.

Each of the second redistribution pattern, the third redistribution pattern and the under bump pattern 115 and each of the second to fourth insulating layers 111b, 111c and 111d may be formed by substantially the same methods as the first redistribution pattern 113a and the first insulating layer 111a.

Figure 4C:
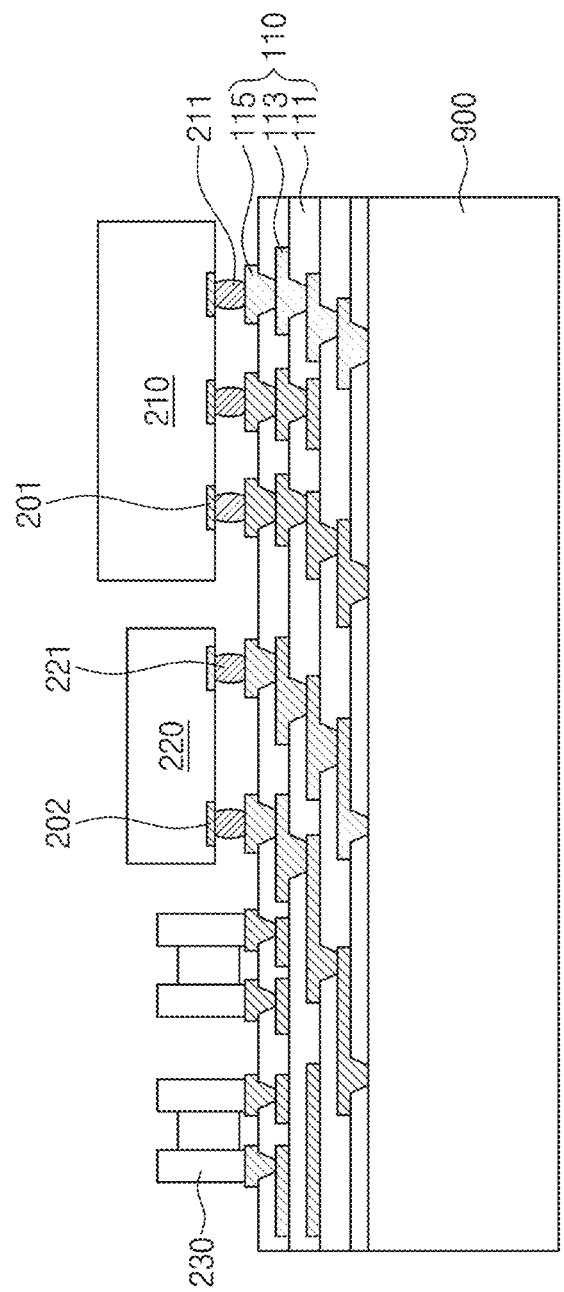

Referring to FIG. 4C, a first semiconductor chip 210, a second semiconductor chip 220 and a passive element 230 may be mounted on the redistribution substrate 110.

The first semiconductor chip 210 having a plurality of first chip pads 201 may be prepared. The first semiconductor chip 210 may be disposed on the redistribution substrate 110 in such a way that the first chip pads 201 are aligned with some of the under bump patterns 115, respectively. First conductive terminals 211 may be formed between the first semiconductor chip 210 and the redistribution substrate 110. The first conductive terminals 211 may connect the first chip pads 201 to some of the under bump patterns 115, respectively.

The second semiconductor chip 220 having a plurality of second chip pads 202 may be prepared. The second semiconductor chip 220 may be disposed on the redistribution substrate 110 in such a way that the second chip pads 202 are aligned with others of the under bump patterns 115, respectively. Second conductive terminals 221 may be formed between the second semiconductor chip 220 and the redistribution substrate 110. The second conductive terminals 221 may connect the second chip pads 202 to the other under bump patterns 115, respectively.

The passive element 230 may be disposed on the redistribution substrate 110. The passive element 230 may be disposed on still others of the under bump patterns 115. The passive element 230 may be provided in plurality. Thicknesses of the first semiconductor chip 210, the second semiconductor chip 220 and the passive element 230 may be different from each other.

Figure 4D:
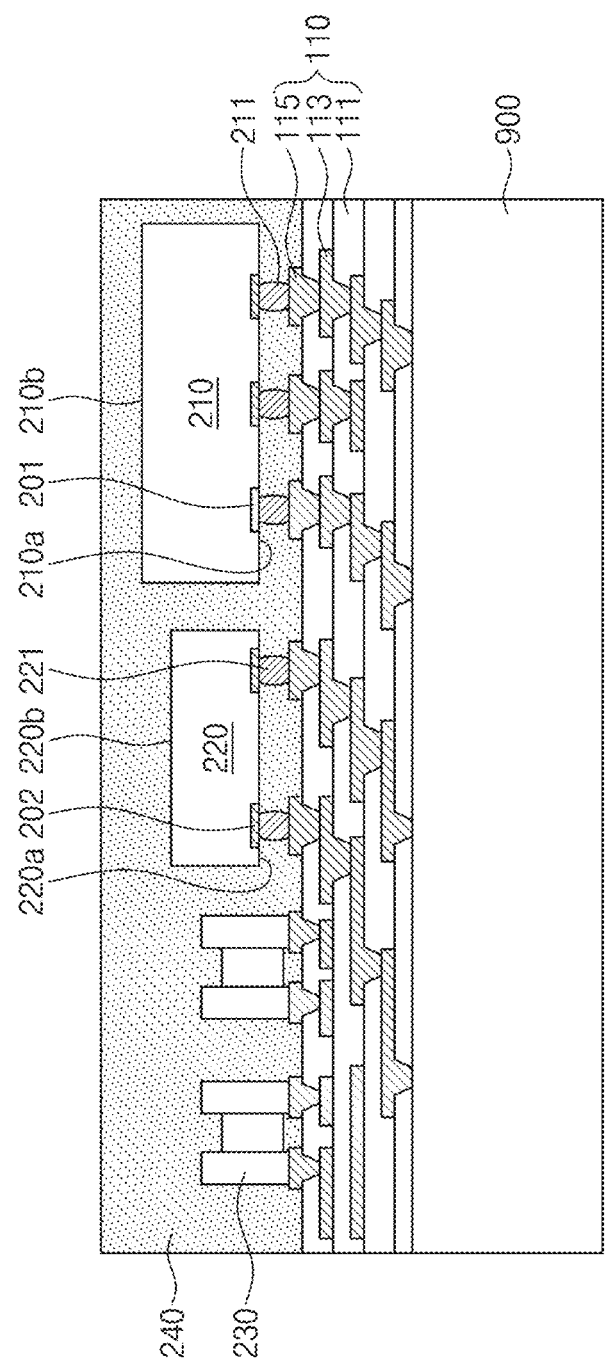

Referring to FIG. 4D, a molding layer 240 may be formed on the redistribution substrate 110 to seal or encapsulate the first semiconductor chip 210, the second semiconductor chip 220 and the passive element 230. The molding layer 240 may extend between the first semiconductor chip 210 and the redistribution substrate 110, between the second semiconductor chip 220 and the redistribution substrate 110 and between the passive element 230 and the redistribution substrate 110 to seal or encapsulate the first and second conductive terminals 211 and 221. Each of the first and second semiconductor chips 210 and 220 may include an active surface 210a or 220a and an inactive surface 210b or 220b, which are opposite to each other. The molding layer 240 may be in contact with the active surfaces 210a and 220a and the inactive surfaces 210b and 220b of the first and second semiconductor chips 210 and 220.

According to some example embodiments of the inventive concepts, because a chip-last process is performed, the molding layer 240 may be in contact with the active surfaces 210a and 220a and the inactive surfaces 210b and 220b of the first and second semiconductor chips 210 and 220. In other words, due to the chip-last process, the molding layer 240 may be in contact with all of top surfaces and bottom surfaces of the semiconductor chips 210 and 220. On the contrary, if a chip-first process is performed, the molding layer 240 may be in contact with only one of a top surface and a bottom surface of a semiconductor chip. However, according to some example embodiments of the inventive concepts, the molding layer 240 may be in contact with both the top and bottom surfaces of each of the first and second semiconductor chips 210 and 220. Thus, a warpage phenomenon of the semiconductor chips 210 and 220 by heat may be effectively controlled or inhibited as compared to a case in which the molding layer 240 is in contact with one of the top and bottom surfaces of each of the first and second semiconductor chips 210 and 220. Accordingly, reliability of the semiconductor package may be improved.

A grinding process may be performed on the molding layer 240. A top surface of the molding layer 240 may be planarized by the grinding process.

Figure 4E:
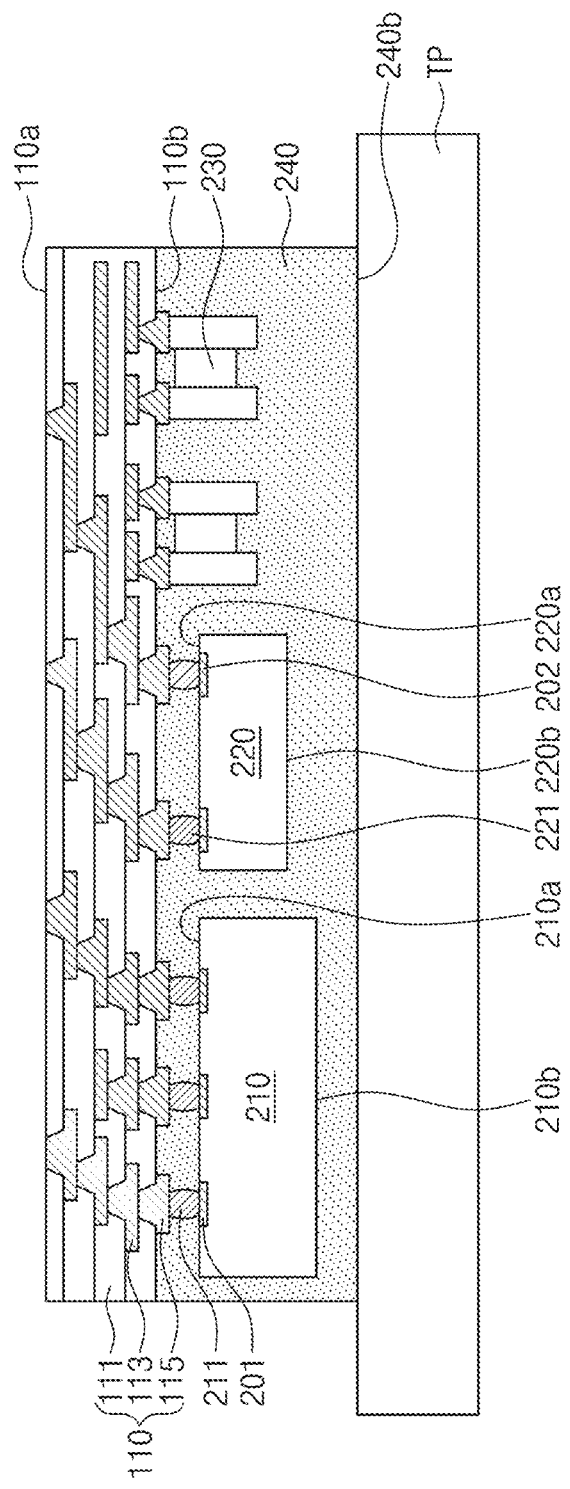

Referring to FIG. 4E, the carrier substrate 900 may be removed from the resultant structure of FIG. 4D, and then, a structure including the redistribution substrate 110 and the molding layer 240 may be turned over and then may be mounted on a dicing tape TP. The redistribution substrate 110 may include a first surface 110a and a second surface 110b, which are opposite to each other. The second surface 110b of the redistribution substrate 110 may be adjacent to the first semiconductor chip 210, the second semiconductor chip 220, and the passive element 230. The active surfaces 210a and 220a of the first and second semiconductor chips 210 and 220 may be adjacent to the second surface 110b of the redistribution substrate 110. A bottom surface 240b of the molding layer 240 may be in contact with the dicing tape TP.

Because the active surface 210a of the first semiconductor chip 210 is disposed adjacent to the second surface 110b of the redistribution substrate 110, the active surface 210a of the first semiconductor chip 210 may be disposed in a direction toward an antenna substrate 310 to be described later. Thus, an electrical path between the first semiconductor chip 210 and the antenna substrate 310 may be shortened to improve a signal transmission speed. Accordingly, electrical characteristics of the semiconductor package may be improved.

Figure 4F:
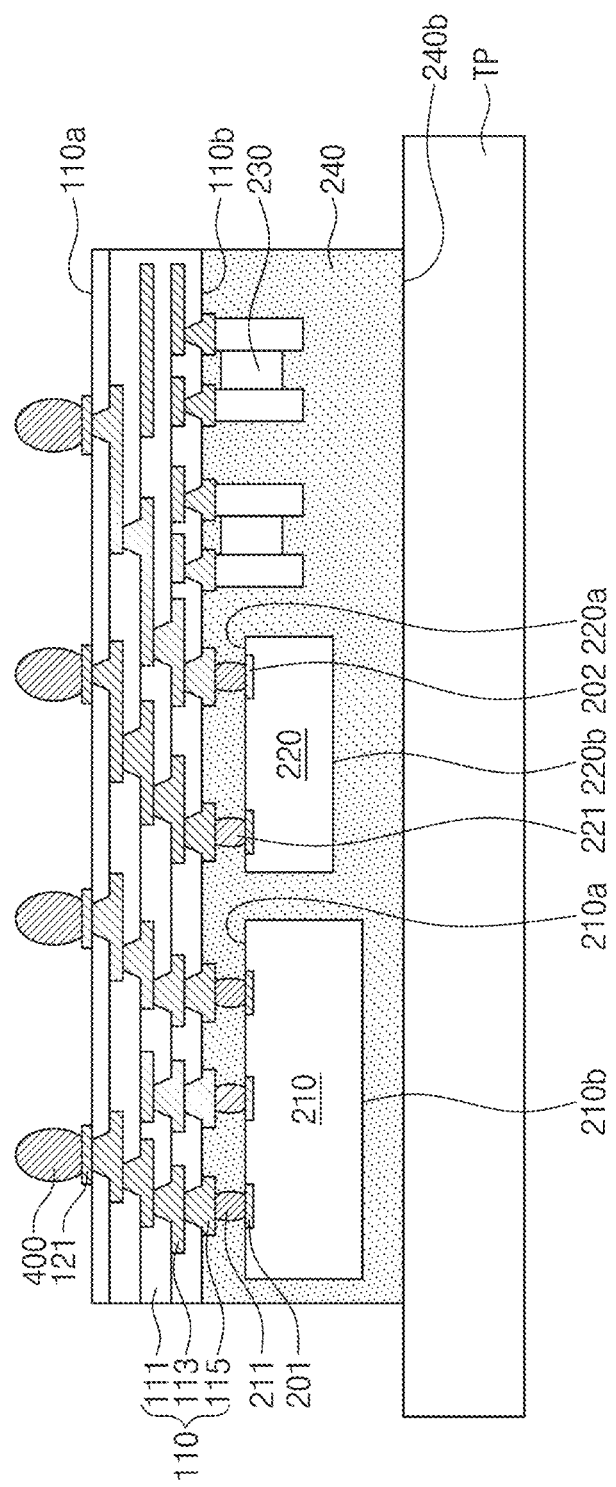

Referring to FIG. 4F, first connection pads 121 may be disposed on the first surface 110a of the redistribution substrate 110. The first connection pads 121 may include a conductive metal material. Each of the first connection pads 121 may be disposed to be aligned with the redistribution pattern 113.

Connection terminals 400 may be formed on top surfaces of the first connection pads 121, respectively. The formation of the connection terminals 400 may include performing a process of attaching or adhering solder balls onto the first connection pads 121. The connection terminal 400 may include at least one of a solder, a pillar, or a bump. The connection terminal 400 may include a conductive material such as a solder material.

Figure 4G:
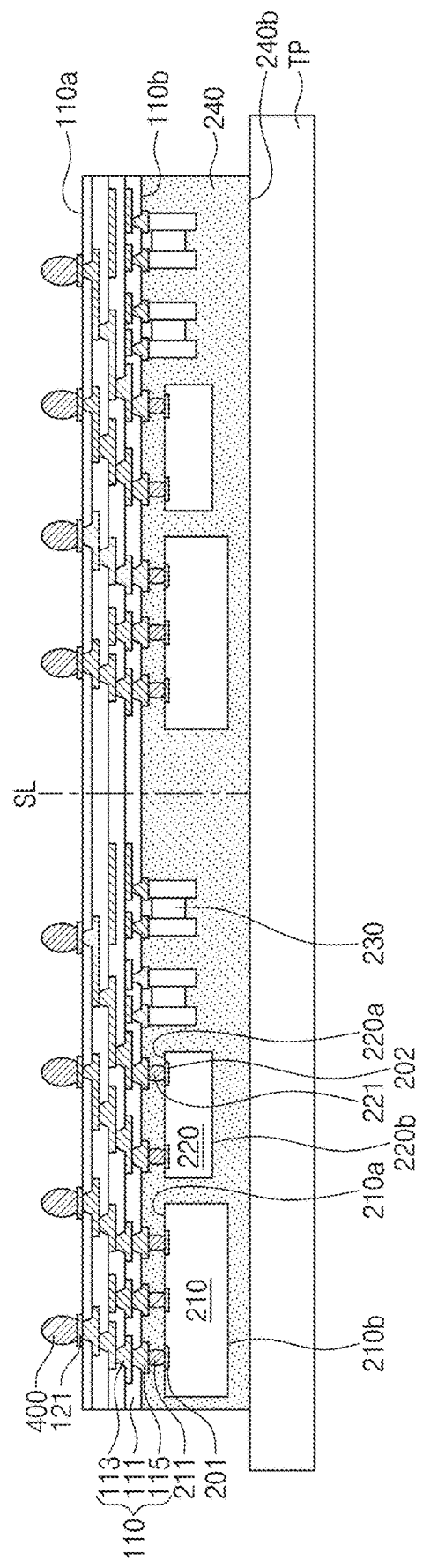

Referring to FIG. 4G, a sawing process may be performed to manufacture a plurality of semiconductor packages. The processes described with reference to FIGS. 4A to 4F may also be applied to a plurality of the first semiconductor chips 210, the second semiconductor chips 220 and the passive elements 230.

The sawing process may include sawing the redistribution substrate 110 and the molding layer 240 along a sawing line SL. Thus, a plurality of semiconductor packages may be manufactured. After the sawing process is completed, the dicing tape TP may be removed.

Referring again to FIGS. 1 and 2, an antenna substrate 310 may be connected to the first surface 110a of the redistribution substrate 110. The antenna substrate 310 may include a second insulating portion 311, via structures 313, shielding layers 315, and antenna patterns 317.

For example, the connecting of the antenna substrate 310 may include turning the resultant structure of FIG. 4G over, disposing second connection pads 123 on the antenna substrate 310 in such a way that the second connection pads 123 are aligned with the via structures 313 of the antenna substrate 310, respectively, and adhering the second connection pads 123 to the connection terminals 400.

A connector 500 may be formed to be electrically connected to one of the second connection pads 123. The connector 500 may be electrically connected to an external substrate (not shown). The connector 500 may be laterally offset from the redistribution substrate 110.

The single semiconductor package was illustrated and described for the purpose of ease and convenience in explanation. However, the method of manufacturing the semiconductor package in the inventive concepts is not limited to a manufacturing method in a wafer level. In certain example embodiments, the semiconductor package may be manufactured in a panel level.

The antenna substrate 310 of the inventive concepts may not include internal connection lines for electrically connecting the first semiconductor chip 210, the second semiconductor chip 220 and the passive elements 230. Thus, the semiconductor package may be miniaturized, and electrical reliability of the semiconductor package may be improved.

Figure 5:
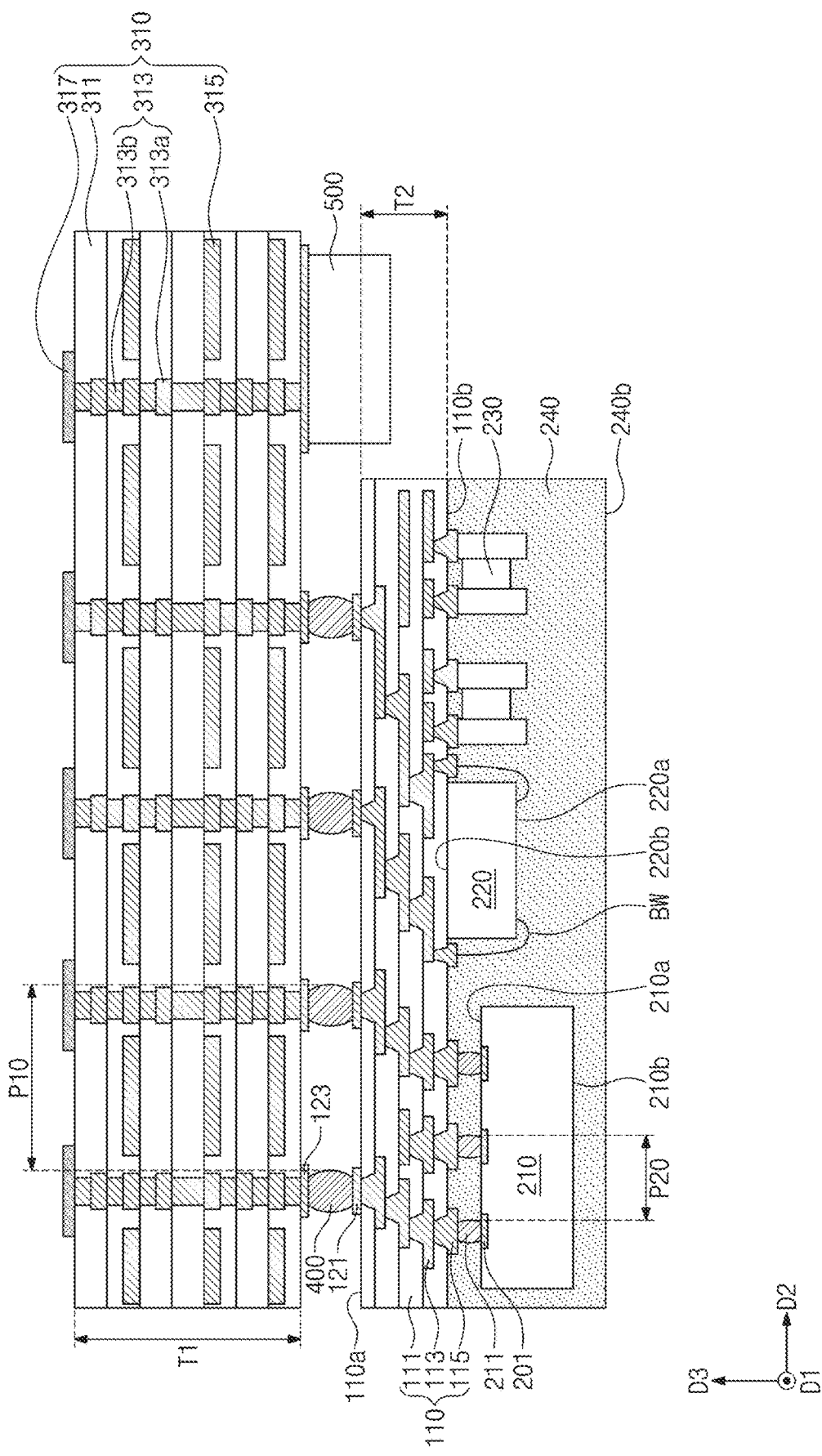
FIG. 5 is a cross-sectional view illustrating a semiconductor package according to some example embodiments of the inventive concepts.

FIG. 5 is a cross-sectional view illustrating a semiconductor package according to some example embodiments of the inventive concepts. In the present example embodiments, the descriptions to the same technical features as in the example embodiments of FIGS. 1 to 3 will be omitted for the purpose of ease and convenience in explanation. In other words, differences between the present example embodiments and the example embodiments of FIGS. 1 to 3 will be mainly described hereinafter.

Referring to FIG. 5, a second semiconductor chip 220 may be electrically connected to the redistribution substrate 110 through a bonding wire BW. In other words, the second conductive terminals 221 described with reference to FIGS. 1 and 2 may be omitted. For example, the second semiconductor chip 220 may include an active surface 220a and an inactive surface 220b, which are opposite to each other. The inactive surface 220b of the second semiconductor chip 220 may be in contact with the second surface 110b of the redistribution substrate 110. The active surface 220a of the second semiconductor chip 220 may be in contact with the molding layer 240.

The bonding wires BW may be provided between the active surface 220a of the second semiconductor chip 220 and corresponding ones of the under bump patterns 115 of the redistribution substrate 110 to electrically connect the second semiconductor chip 220 and the redistribution substrate 110.

Figure 6:
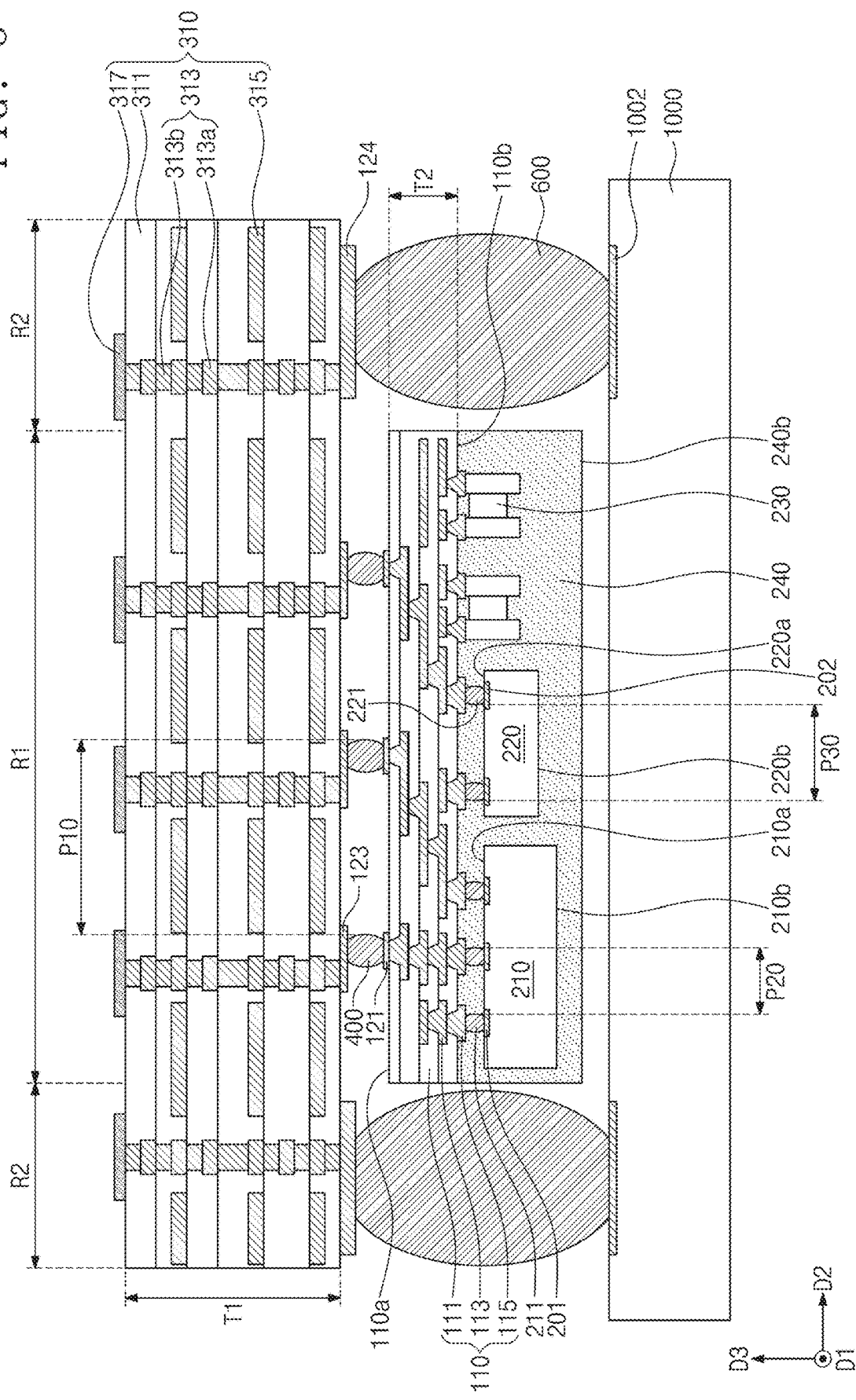
FIG. 6 is a cross-sectional view illustrating a semiconductor package according to some example embodiments of the inventive concepts.

FIG. 6 is a cross-sectional view illustrating a semiconductor package according to some example embodiments of the inventive concepts. In the present example embodiments, the descriptions to the same technical features as in the example embodiments of FIGS. 1 to 3 will be omitted for the purpose of ease and convenience in explanation. In other words, differences between the present example embodiments and the example embodiments of FIGS. 1 to 3 will be mainly described hereinafter.

Referring to FIGS. 2 and 6, the antenna substrate 310 may include a central portion R1 and edge portions R2. The edge portions R2 may be regions located at both ends of the antenna substrate 310, respectively. The central portion R1 may be a region located at a center or a central area of the antenna substrate 310. The central portion R1 may be located between the edge portions R2. The edge portions R2 may be spaced apart from each other with the central portion R1 interposed therebetween.

The redistribution substrate 110 may vertically overlap with the central portion R1 of the antenna substrate 310. The redistribution substrate 110 may be laterally offset from the edge portions R2 of the antenna substrate 310.

External terminals 600 may be bonded to bottom surfaces of the edge portions R2 of the antenna substrate 310. Each of the external terminals 600 may include at least one of a solder, a pillar, or a bump. The external terminals 600 may include a conductive material such as a solder material. Third connection pads 124 may be disposed between the antenna substrate 310 and the external terminals 600. Each of the third connection pads 124 may be in contact with the via structure 313 of the antenna substrate 310. Each of the third connection pads 124 may include a conductive metal material.

A bottom end of each of the external terminals 600 may be located at a lower level than the bottom surface of the first semiconductor chip 210. In other words, the bottom end of each of the external terminals 600 may be located at a lower level than the inactive surface 210b of the first semiconductor chip 210. The bottom end of each of the external terminals 600 may be located at a lower level than the bottom surfaces of the second semiconductor chip 220 and the passive element 230.

The external terminals 600 may be connected to an external substrate 1000. In other words, the antenna substrate 310 may be electrically connected to the external substrate 1000 through the external terminals 600. The external substrate 1000 may be a mother board or main board of various electronic products or may be a body in which a semiconductor package is received directly. However, example embodiments of the inventive concepts are not limited thereto. The external substrate 1000 may correspond to at least one of various electronic devices in which the semiconductor package is received, mounted or connected.

The external substrate 1000 may include external substrate pads 1002. The external substrate pads 1002 may be disposed adjacent to a top surface of the external substrate 1000. The external substrate pads 1002 may be exposed at the top surface of the external substrate 1000. The external substrate pads 1002 may include a conductive metal material. The external terminals 600 may be disposed between the external substrate pads 1002 and the third connection pads 124.

Internal connection lines may be excluded from the antenna substrate of the semiconductor package according to some example embodiments of the inventive concepts, and the redistribution patterns in the redistribution substrate may function as connection lines for electrically connecting the antenna substrate and the semiconductor chip. Thus, a thickness of the semiconductor package may be reduced as compared to a case in which internal connection lines are disposed in an antenna substrate. Accordingly, the semiconductor package may be miniaturized.

Further, pattern delamination and/or short caused when internal connection lines are formed in an antenna substrate may be mitigated or inhibited/prevented, thereby improving the electrical reliability of the semiconductor package.

Moreover, in the semiconductor package according to some example embodiments of the inventive concepts, the molding layer may be in contact with the active surface and the inactive surface of the semiconductor chip. Thus, a warpage phenomenon of the semiconductor package may be effectively controlled or inhibited as compared to a case in which the molding layer is in contact with one of the active surface and the inactive surface of the semiconductor chip. Accordingly, reliability of the semiconductor package may be improved.

Furthermore, in the semiconductor package according to some example embodiments of the inventive concepts, the active surface of the semiconductor chip may be disposed in a direction toward the antenna substrate. Thus, an electrical path between the semiconductor chip and the antenna substrate may be shortened, thereby improving a signal transmission speed. Accordingly, the electrical characteristics of the semiconductor package may be improved.

While the inventive concepts have been described with reference to some example embodiments, it will be apparent to those skilled in the art that various changes and modifications may be made without departing from the spirits and scopes of the inventive concepts. Therefore, it should be understood that the above example embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor package comprising:
   a redistribution substrate including a first surface and a second surface that are opposite to each other;
   an antenna substrate on the first surface of the redistribution substrate, the antenna substrate including a first insulating portion and antenna patterns on a top surface of the first insulating portion; and
   a first semiconductor chip on the second surface of the redistribution substrate,
   wherein the redistribution substrate includes a second insulating portion and a redistribution pattern in the second insulating portion,
   wherein the redistribution pattern includes an interconnection portion extending parallel to a top surface of the second insulating portion and a via portion protruding from the interconnection portion toward the first surface of the redistribution substrate,
   wherein a width of the via portion decreases as a height in a direction from the second surface toward the first surface of the redistribution substrate increases,
   wherein the first semiconductor chip includes an active surface and an inactive surface that are opposite to each other,
   wherein the active surface of the first semiconductor chip is adjacent to the second surface of the redistribution substrate, and
   wherein the antenna substrate further comprises
      via structures penetrating the first insulating portion and electrically connecting to the antenna patterns, respectively, and
      a shielding layer being a horizontal structure and between an adjacent pair of the via structures, the shielding layer being apart from the via structures, and
      the antenna patterns electrically connect to the first semiconductor chip through the via structures and the redistribution pattern.

2. The semiconductor package of claim 1, wherein a thickness of the antenna substrate is greater than a thickness of the redistribution substrate.

3. The semiconductor package of claim 1, further comprising:
   a second semiconductor chip on the second surface of the redistribution substrate,
   wherein the second semiconductor chip includes an active surface and an inactive surface that are opposite to each other, and
   wherein the active surface of the second semiconductor chip is adjacent to the second surface of the redistribution substrate.

4. The semiconductor package of claim 1,
   a second semiconductor chip on the second surface of the redistribution substrate,
   wherein the second semiconductor chip includes an active surface and an inactive surface that are opposite to each other,
   wherein the inactive surface of the second semiconductor chip is adjacent to the second surface of the redistribution substrate, and wherein the second semiconductor chip is electrically connected to the redistribution substrate through a bonding wire.

5. The semiconductor package of claim 1, further comprising:
a molding layer on the second surface of the redistribution substrate,
wherein the molding layer is in contact with the active surface and the inactive surface of the first semiconductor chip.

6. The semiconductor package of claim 1, wherein the first insulating portion and the second insulating portion include different materials.

7. The semiconductor package of claim 1, wherein
conductive terminals are between the first semiconductor chip and the redistribution substrate,
connection terminals are between the antenna substrate and the redistribution substrate, and
a pitch of the connection terminals is greater than a pitch of the conductive terminals.

8. The semiconductor package of claim 1, wherein
the antenna substrate includes a central portion and an edge portion, and
the redistribution substrate overlaps with the central portion of the antenna substrate, and
the semiconductor package further includes an external terminal bonded to a bottom surface of the edge portion of the antenna substrate and the external terminal is horizontally outside an area of the redistribution substrate and does not overlap the redistribution substrate in a vertical direction.

9. The semiconductor package of claim 8, wherein a bottom end of the external terminal is lower than a bottom surface of the first semiconductor chip.

10. A semiconductor package comprising:
a redistribution substrate including a first surface and a second surface that are opposite to each other;
an antenna substrate on the first surface of the redistribution substrate, the antenna substrate including a first insulating portion and antenna patterns on a top surface of the first insulating portion;
a first semiconductor chip on the second surface of the redistribution substrate; and
a molding layer covering the first semiconductor chip,
wherein at least one of the antenna patterns is electrically connected to the first semiconductor chip,
wherein the redistribution substrate includes a second insulating portion and a redistribution pattern in the second insulating portion,
wherein the redistribution pattern includes an interconnection portion extending parallel to a top surface of the second insulating portion and a via portion protruding from the interconnection portion toward the first surface of the redistribution substrate,
wherein a width of an upper portion of the via portion is less than a width of a lower portion of the via portion,
wherein the molding layer is in contact with an active surface and an inactive surface of the first semiconductor chip that are opposite to each other, and
wherein the antenna substrate further comprises
via structures penetrating the first insulating portion and electrically connecting to the antenna patterns, respectively, and
a shielding layer being a horizontal structure and between an adjacent pair of the via structures, the shielding layer being apart from the via structures.

11. The semiconductor package of claim 10, wherein the active surface of the first semiconductor chip is adjacent to the second surface of the redistribution substrate.

12. The semiconductor package of claim 10, further comprising:
a second semiconductor chip and a passive element on the second surface of the redistribution substrate,
wherein an active surface of the second semiconductor chip is adjacent to the second surface of the redistribution substrate.

13. The semiconductor package of claim 10, wherein
conductive terminals are between the first semiconductor chip and the redistribution substrate,
connection terminals are between the antenna substrate and the redistribution substrate, and
a pitch of the connection terminals is greater than a pitch of the conductive terminals.

14. A semiconductor package comprising:
a redistribution substrate including a first surface and a second surface that are opposite to each other;
an antenna substrate on the first surface of the redistribution substrate, the antenna substrate including a first insulating portion, antenna patterns on a top surface of the first insulating portion, via structures penetrating the first insulating portion and electrically connecting to the antenna patterns, respectively, and a shielding layer being a horizontal structure and between the via structures adjacent to each other;
connection terminals between the antenna substrate and the redistribution substrate;
first connection pads between the redistribution substrate and the connection terminals;
second connection pads between the via structures and the connection terminals;
each of a first semiconductor chip, a second semiconductor chip and a passive element being on the second surface of the redistribution substrate, each of the first and second semiconductor chips including an active surface and an inactive surface that are opposite to each other;
first chip pads adjacent to the active surface of the first semiconductor chip;
second chip pads adjacent to the active surface of the second semiconductor chip;
first conductive terminals between the redistribution substrate and the first chip pads;
second conductive terminals between the redistribution substrate and the second chip pads; and
a molding layer covering the first semiconductor chip and the second semiconductor chip,
wherein the redistribution substrate further includes,
a second insulating portion,
redistribution patterns in the second insulating portion; and
under bump patterns between the redistribution patterns and the first and second conductive terminals,
wherein the redistribution patterns include,
an interconnection portion extending parallel to a top surface of the second insulating portion, and
a via portion protruding from the interconnection portion toward the first surface of the redistribution substrate,
wherein a width of the via portion decreases as a height in a direction from the second surface toward the first surface of the redistribution substrate increases, and
wherein the active surface of each of the first and second semiconductor chips is adjacent to the second surface of the redistribution substrate.

15. The semiconductor package of claim 14, wherein the molding layer is in contact with the active surface and the inactive surface of the first semiconductor chip.

16. The semiconductor package of claim 14, wherein a thickness of the antenna substrate is greater than a thickness of the redistribution substrate.

17. The semiconductor package of claim 14, wherein the first insulating portion and the second insulating portion include different materials.

18. The semiconductor package of claim 14, wherein
- the antenna substrate includes a central portion and an edge portion, and
- the redistribution substrate overlaps with the central portion of the antenna substrate, and
- the semiconductor package further includes an external terminal bonded to a bottom surface of the edge portion of the antenna substrate and the external terminal is horizontally outside an area of the redistribution substrate and does not overlap the redistribution substrate in a vertical direction.

* * * * *